United States Patent [19]
Kalyankjumar et al.

[11] Patent Number: 5,254,862
[45] Date of Patent: Oct. 19, 1993

[54] DIAMOND FIELD-EFFECT TRANSISTOR WITH A PARTICULAR BORON DISTRIBUTION PROFILE

[75] Inventors: Das Kalyankjumar, Raleigh; David L. Dreifus; Alison J. Tessmer, both of Cary; Vasudev Venkatesan, Raleigh, all of N.C.

[73] Assignee: Kobe Steel U.S.A., Inc., New York, N.Y.

[21] Appl. No.: 744,598

[22] Filed: Aug. 14, 1991

[51] Int. Cl.$^5$ ............... H01L 31/0132; H01L 29/167; H01L 29/207; H01L 29/76

[52] U.S. Cl. ..................... 257/77; 257/607; 257/611; 257/412; 257/192

[58] Field of Search ................ 357/23.15, 23.1, 23.4, 357/23.6; 257/77, 607, 611, 412, 192

[56] References Cited

U.S. PATENT DOCUMENTS

| | | | |
|---|---|---|---|
| 5,002,899 | 3/1991 | Geis et al. | 437/173 |
| 5,107,315 | 4/1992 | Kumagai et al. | 357/23.15 |

OTHER PUBLICATIONS

"Field Effect Transistors Using Boron-doped Diamond Epitaxial Films"; Shiomi et al—Nov. 8, 1989–pp. TP L2153–L2154.

"Ohmic Contacts to Semiconductor Diamond", Moazed et al–, IEEE electron device letters, vol. 9; Jul. 1988.

Fountain et al., "IGFET Fabrication on Homoepitaxial Diamond Using In Situ Boron and Lithium Doping", presented at the Electrochemical Society Meeting held in Washington, D.C. in May 1991.

Prins, "*Preparation of Ohmic Contacts to Semiconducting Diamond*", Schonland Research Centre, University of the Witwatersrand, Johannesburg 2050, pp. 1562–1564, Jul. 5, 1989.

Braunstein et al., "*Effective p-type Doping of Diamond by Boron Ion Implantation*", J. Appl. Phys. 54 (4), pp. 2106–2108, Apr. 1983.

Gildenblat et al., "High–Temperature Thin–Film Diamond Field–Effect Transistor Fabricated Using a Selective Growth Method", IEEE Electron Device Letters, vol. 12, No. 2, pp. 37–39, Feb. 1991.

Moazed et al., "*A Thermally Active Solid State Reaction Process for Fabricating Ohmic Contacts to Semiconducting Diamond*", J. Appl. Phys. 68 (5), pp. 2246–2254, Sep. 1, 1990.

Hewett et al., "Fabrication of an Insulated Gate Diamond FET for High Temperature Applications", pp. 168–173, presented at the International High Temperature Electronics Conference in Albuquerque, New Mexico in Jun. of 1991.

Tsai et al., "*Diamond MESFET Using Ultrashallow RTP Boron Doping*", IEEE Electron Device Letters, vol. 12, No. 4, pp. 157–159, Apr. 1991.

Shiomi et al., "*Characterization of Boron–Doped Diamond Epitaxial Films and Applications for High-Voltage Schottky Diodes and MESFET's* ", New Diamond Science and Technology, pp. 975–980, 1991 MRS Int. Conf. Proc.

*Primary Examiner*—Rolf Hille
*Assistant Examiner*—Wael Fahmy
*Attorney, Agent, or Firm*—Bell, Seltzer, Park & Gibson

[57] ABSTRACT

An insulated gate field-effect transistor including an active diamond layer having a desired boron doping concentration profile. The boron doping concentration profile generally decreases with increasing depth into the diamond layer so that the active channel has a doping sufficient for field-effect transistor operation. An insulated gate electrode is formed on the highly doped surface and provides a low gate leakage current and passivates the surface of the diamond layer.

16 Claims, 3 Drawing Sheets

DIAMOND FIELD-EFFECT TRANSISTOR WITH A PARTICULAR BORON DISTRIBUTION PROFILE

FIELD OF THE INVENTION

This invention relates to semiconductor devices, and more particularly, to a high temperature diamond field-effect transistor.

BACKGROUND OF THE INVENTION

Diamond is a preferred material for semiconductor devices because it has semiconductor properties that are better than traditionally used silicon (Si), germanium (Ge) or gallium arsenide (GaAs). Diamond provides a higher energy band gap, a higher breakdown voltage and a higher saturation velocity than these traditional semiconductor materials.

These properties of diamond yield a substantial increase in projected cutoff frequency and maximum operating voltage compared to devices fabricated using Si, Ge, or GaAs. Si is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, i.e., diamond is a "radiation-hard" material.

Because of the advantages of diamond as a material for semiconductor devices, there is at present an interest in the growth and use of diamond for high temperature and radiation-hardened electronic devices, particularly field-effect transistors which are fundamental building blocks of modern integrated circuits. For example, it is known in the art to form a diamond MESFET (metal-semiconductor field-effect transistor) using a rapid thermal processing (RTP) technique to drive in and activate boron in a type IIa diamond substrate. See Tsai et al. in *Diamond MESFET Using Ultrashallow RTP Boron Doping*, IEEE Electron Device Letters, Vol. 12, No. 4, pp. 157-159, April 1991. The MESFET has a metal-semiconductor rectifying contact as the gate electrode. The Tsai article proposes using cubic boron nitride as a thermal diffusion source to introduce boron as the p-type dopant using an RTP technique at high temperature (i.e., about 1400° C.). Unfortunately, such high temperature processing is beyond the capability of most commercially available processing chambers which are typically only operable to about 1200° C. Moreover, the type II diamond used in this MESFET includes nitrogen which produces nitrogen donors and compensates a portion of the acceptors. This compensation phenomena reduces the effectiveness of a portion of the boron dopant.

Another field-effect transistor is proposed by Hewett et al. in a paper entitled *Fabrication of an Insulated Gate Diamond FET for High Temperature Applications*, presented at the International High Temperature Electronics Conference in Albuquerque New Mexico in June of 1991. The IGFET (insulated gate field-effect transistor) includes a boron-doped diamond layer formed by uniformly doping the diamond layer with multiple ion implantation steps. Hewett suggests that a significant improvement in specific contact resistance may be obtained by more heavily doping the source and drain regions of the device, such as by using an additional ion implantation step for these regions. Unfortunately, the multiple implantation steps must be carried out at very low temperatures (i.e., about 77° K.), and therefore require liquid nitrogen cooling.

Gildenblat, et al. in *High-Temperature Thin-Film Diamond Field-Effect Transistor Fabricated Using a Selective Growth Method*, IEEE Electron Device Letters, Vol. 12, No. 2, pp. 37-39, Feb. 1991, proposes a method for making a diamond MOSFET (metal-oxide semiconductor field-effect transistor) by depositing a homoepitaxial diamond film on a substrate. Boron doping is achieved in situ by placing boron powder on the substrate holder before deposition of the diamond layer. During diamond layer growth, the plasma etches the boron powder and forms boron hydrides. The boron is thus incorporated into the diamond layer in an expectedly uniform distribution. The MOSFET includes an insulating silicon dioxide layer separating the gate electrode from the active channel region of the diamond layer. Similarly, it has been proposed to use diborane as a gaseous source for plasma deposition in conjunction with the diamond layer formation. See Fountain et al. in *IGFET Fabrication on Homoepitaxial Diamond Using In Situ Boron and Lithium Doping*, presented at the Electrochemical Society Meeting held in Washington D.C. in May 1991.

Despite advancements in the art of diamond field-effect transistors, improvements are still necessary to produce commercially acceptable devices operable at temperatures beyond the limits of conventional semiconductor materials. Low resistance ohmic contacts for the source and drain electrodes of a diamond field-effect transistors are also desirable to improve operating performance. Moreover, the prior art processing steps for making the boron-doped diamond layers for field-effect transistors have required either complicated and expensive liquid nitrogen cooling, or have required high temperatures beyond the range of typical commercially available processing equipment. In addition, the prior art field-effect transistors have required expensive single crystal diamond as a component thereof.

SUMMARY OF THE INVENTION

It is therefore an object of the present invention to provide an improved diamond field-effect transistor and method of making the same which operates at elevated temperatures.

It is another object of the invention to provide a diamond field-effect transistor and method of making the same which has low electrical resistance for the source and drain electrodes.

It is still another object of the present invention to provide a diamond field-effect transistor and method for making the same which does not require a relatively expensive single crystal diamond substrate.

These and other objects according to the invention are provided by an insulated gate field-effect transistor which includes an active diamond layer having a desired boron doping concentration. The boron doping concentration follows a desired profile extending in the depth direction into the diamond layer, with a higher doping concentration at the outer surface of the diamond layer. The higher doping at the outer surface produces low resistance electrical connections for the source and drain electrodes of the transistor. In addition, the boron-doped diamond layer provides the active channel region for the field-effect transistor. Accordingly, the desired boron doping concentration generally decreases with increasing depth into the diamond layer and provides an overall doping of the active channel region sufficient for proper operation of the field-effect transistor.

The active channel layer of the transistor is made by ion implantation at nominal room temperature or slightly higher temperatures which may be readily obtained using commercially available ion implanters. As used herein the phrase "nominal room temperature" relates to a process (e.g., the implantation process) which starts at about room temperature, and the steps of the process (e.g., ion implantation) causes the temperature of the diamond to increase to a slightly higher value, such as about 100° C., for example.

The ion implantation is followed by an annealing step, for example, heating to a temperature of from about 950° C. to about 1200° C. A graphitized layer is thereby formed from the radiation damaged outer surface portion of the diamond layer. This graphitized layer has a well-defined boundary with the underlying diamond layer. The graphitized layer may be readily removed, for example, using a hot acid etch to thereby expose the underlying boron-doped diamond layer.

The exposed diamond layer has a boron doping concentration profile which is relatively high at the outer surface because the implantation step produces a generally Gaussian shape with the concentration expressed as a logarithm versus linear depth into the diamond layer. The formation and removal of the graphite layer removes a portion of the diamond layer leaving the exposed diamond layer having a boron doping concentration profile that is a truncated portion of the Gaussian distribution near its peak. The truncated Gaussian profile may generally be approximated by a straight line defined by a peak concentration at the surface and a negligible concentration at a predetermined depth into the diamond layer.

The method according to the invention permits a flexible fabrication process whereby a desired boron concentration profile may be created by controlling processing parameters. The boron implantation energy, boron dosage and the temperature of the diamond layer during the implantation may be selected to thereby produce a desired doping concentration profile. Thus, the spread and peak of the Gaussian shape of the boron-doping concentration may be controlled, as well as the portion of the Gaussian distribution that is removed by the graphite etch.

Using a straight line approximation of the truncated Gaussian boron doping concentration, a profile may be obtained where the surface concentration is about $10^{21}$ atoms/cm$^3$ and wherein the boron doping becomes negligible, about $10^{19}$ atoms/cm$^3$ which is about the limit of measurable levels using secondary ion mass spectrometry (SIMS), at a depth of about 0.25 $\mu$m (2500 Å). A profile may also be achieved wherein the surface concentration is about $10^{19}$ atoms/cm$^3$ and wherein the depth at which the concentration becomes negligible is about 1.0 $\mu$m (10,000 Å). As would readily be understood by those skilled in the art, the surface peak and the depth of the desired concentration profile may be selected by controlling the processing parameters.

The source and drain electrodes for the transistor may be formed by depositing a first metal layer, such as a refractory metal (e.g., titanium) and then depositing a second layer of gold thereon to protect the refractory metal from oxidation. The bilayer electrodes may then be annealed. The source and drain electrodes have low electrical resistance because of the high boron doping concentration at the surface of the diamond layer. In an alternate embodiment of the invention, the source and drain regions of the diamond layer may be subjected to an additional boron implantation, annealing, and graphite etching to form even higher boron concentrations at these regions. This is in contrast to conventional prior art transistors which have an essentially uniform boron doping concentration profile.

Because the boron doping concentration is desirably high at the surface of the diamond layer to form low resistance source and drain electrodes, an insulated gate for the field-effect transistor is required. A prior art MESFET, that is a field-effect transistor with a gate electrode directly formed on the channel region, would have excessively high gate leakage current or would simply fail to operate with the relatively high surface boron doping concentration as in the invention.

The insulated gate may be formed by depositing an insulating layer on the diamond layer between the locations for the source and drain electrodes. Exemplary insulating layers can include diamond, silicon dioxide, silicon nitride, aluminum oxide and the like formed using conventional techniques. A metal contact layer may be deposited and patterned on the gate insulating layer, also using conventional techniques, to thereby complete the insulated gate electrode. The insulated gate electrode reduces the leakage current that may occur in other diamond field-effect transistors having a Schottky contact for the gate electrode. The insulating layer also serves to passivate the surface of the diamond layer.

DETAILED DESCRIPTION OF THE PREFERRED EMBODIMENTS

Figure 1:
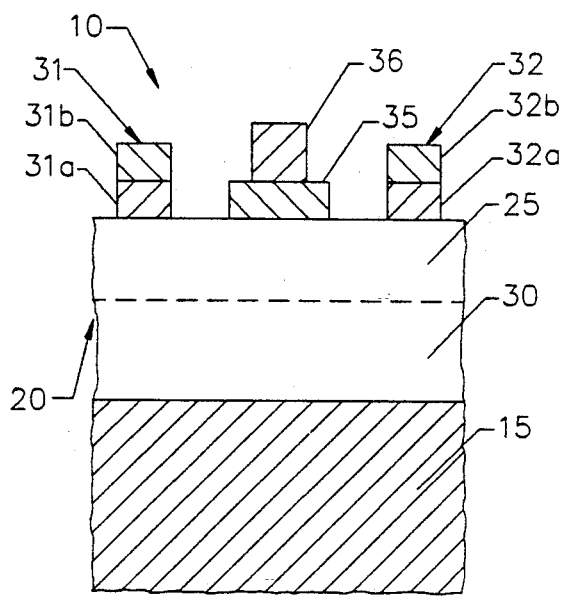
FIG. 1 is a cross-sectional side elevation view of an insulated gate field-effect transistor according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, Applicants provide these embodiments so that this disclosure will be thorough and complete, and will fully convey the scope of the invention to those skilled in the art. In the drawings, the thickness of layers and regions are exaggerated for clarity. Prime notation is used to indicate similar elements throughout.

Referring to FIG. 1, an insulated gate field-effect transistor 10 according to the present invention is shown. The transistor 10 includes a substrate 15 and a diamond layer 20 on the substrate. The diamond layer 20 includes a boron-doped outer portion 25 and an undoped insulating portion 30 adjacent the substrate 15. The diamond layer 20 preferably has a relatively low nitrogen content so that nitrogen donors do not compensate for the acceptors.

The substrate 15 may be an insulating single crystal diamond substrate and the diamond layer 20 may be a homoepitaxial diamond layer. The single crystal diamond substrate is preferably about 250 $\mu$m thick and the homoepitaxial layer is preferably about 0.25 $\mu$m to about 2.5 $\mu$m thick. A polycrystalline diamond layer may also be used and formed on a substrate. Exemplary substrates include silicon, silicon nitride, aluminum oxide, and composites of silicon nitride and aluminum oxide. For a silicon substrate, the preferred thickness of the silicon is about 250 $\mu$m to about 500 $\mu$m, and the preferred thickness of the polycrystalline diamond layer is about 10 $\mu$m. As would be readily be understood by those skilled in the art, instead of a substrate 15 and a separate diamond layer 20, equivalently, a single crystal diamond substrate may be used with only an outer portion thereof doped with boron.

The transistor 10 includes a source electrode 31 and a drain electrode 32 on the outer surface of the boron-doped diamond layer 25 in a laterally spaced apart relation. The source electrode 31 and the drain electrode 32 are preferably formed of a first metal layer 31a, 32a of one or more refractory metals and a second layer 31b, 32b of gold to thereby protect the underlying refractory metal from oxidation. The refractory metal layer 31a, 32a may preferably be about 200 Å to about 400 Å thick, and the gold layer 31b, 32b may preferably be about 1000 Å to about 1500 Å thick. The bilayer electrodes may then be annealed to form the source electrode 31 and the drain electrode 32. Exemplary refractory metals are transition element metals, and preferably are selected from the group consisting of Group IV, V and VI transition element metals (CRC Handbook, 71st Ed.) and include titanium, tantalum, tungsten, molybdenum, hafnium and niobium. The process for forming the source electrode 31 and the drain electrode 32 as described above is similar to the process for forming ohmic contacts on diamond as discussed by Moazed et al. in *Thermally Activated Solid State Reaction Process for Fabricating Ohmic Contacts to Semiconducting Diamond*, J. Appl. Phys. 68(5), Sept. 1, 1990.

The boron-doped diamond layer 25 according to the invention has a desired boron doping concentration profile extending in the depth direction into the diamond layer 20. A high boron doping concentration at the surface of the boron-doped diamond layer 25 lowers the electrical resistance of the source and drain electrodes 31, 32.

The active channel region for the transistor 10 is the region in the doped diamond layer 25 between the source and drain electrodes 31, 32 and extending to a depth of about 0.25 $\mu$m (2500 Å) to about 1.0 $\mu$m (10,000 Å). If the boron doping concentration in this active channel region of the transistor 10 were made too high, the channel region would not be semiconducting and, accordingly, the device would fail to operate as a field-effect transistor. Therefore, the doped diamond layer 25 has a boron doping concentration profile that is relatively high at the surface for ensuring low resistance source and drain contacts 31, 32. Moreover, a boron doping concentration for the channel region consistent for field-effect transistor operation may also be selected by providing a boron concentration profile which generally decreases with increasing depth into the diamond layer 25, as more fully explained below.

The transistor 10 also includes an insulating layer 35 on the boron-doped diamond surface 25 adjacent the active channel region, and a gate electrode 36 on the gate insulating layer 35. The gate insulating layer 35 may be an insulating diamond layer, or a layer of silicon dioxide, silicon nitride, or aluminum oxide. The insulated gate structure results in a reduction of leakage current, which remains relatively small even at elevated temperatures (e.g., about 300° C.) as compared to other diamond field-effect transistors with Schottky gates. The insulated gate also serves to passivate the surface of the channel region.

Figure 2:
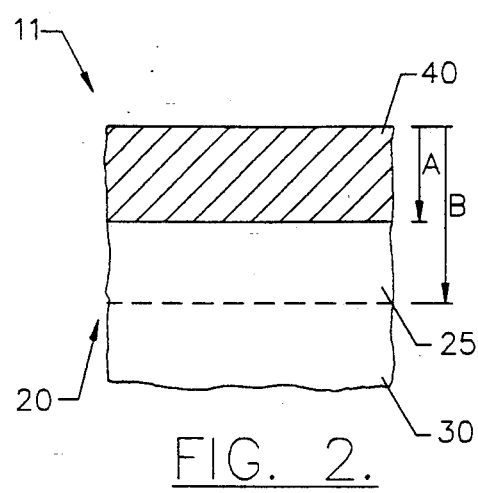
FIG. 2 is cross-sectional side elevation view of the insulated gate field-effect transistor as shown in FIG. 1 during an intermediate processing step.
Figure 3:
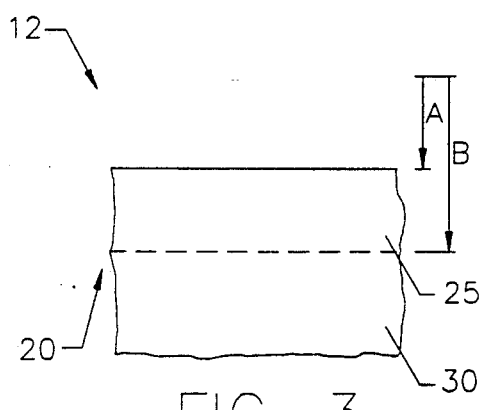
FIG. 3 is cross-sectional side elevation view of the insulated gate field-effect transistor as shown in FIG. 1 during another intermediate processing step.
Figure 4:
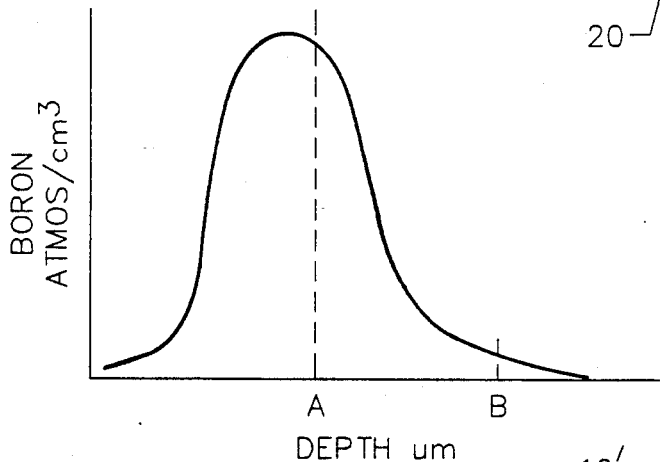
FIG. 4 is a theoretical graph of boron doping concentration versus depth into the diamond layer corresponding to the intermediate processing steps of FIGS. 2 and 3.

The method for making the insulated gate field-effect transistor 10 according to the invention may best be understood with reference to FIGS. 2-5. FIG. 2 shows a portion of an intermediate structure 11 during fabrication of the insulated gate field-effect transistor 10 as shown in FIG. 1. More particularly, the intermediate structure 11 includes the diamond layer 20 after the diamond layer has been implanted with boron ions and subsequently annealed. The implantation process produces a boron doping concentration profile roughly as shown in FIG. 4. The profile generally follows a generally Gaussian shape when the concentration is expressed on a logarithmic scale, and extends from the surface to a depth B as shown along the horizontal axis of the graph of FIG. 4.

The implantation process produces a spatial radiation damage (vacancies and interstitials) in the diamond layer having a profile that generally peaks before the peak of the Gaussian boron concentration profile as described in *Preparation of Ohmic Contacts to Semiconducting Diamond*, by J. Prins, in the J. Phys. D: Appl. Phys. 22, pp. 1562-64, July 1989. While Applicants do not wish to be bound to any particular theory, it is believed that interstitial atoms do diffuse at the implantation temperature selected, which enables those which do not occupy vacancies to escape from the ion-damaged region. Thus, during the implantation process, the immobile vacancy density in this region increases with ion dose and finally exceeds a critical limit at the temperature and implant conditions selected. Beyond this limit, the diamond lattice is able to graphitize, that is, collapse to an amorphous carbon structure, particularly when annealed at high temperature. Thus, after implantation and annealing, a graphite layer 40 is formed from a portion of the doped diamond layer 25 extending to a depth A as shown in FIG. 2.

The boundary between the graphite layer 40 and the underlying diamond layer 25 is well defined. Accordingly, the graphite layer 40 may be readily removed by a subsequent hot acid etching. Exemplary acid etches include boiling chromic and sulfuric acid solution or a boiling 1:4:3 solution of perchloric, sulfuric and nitric acid. After the graphite layer 40 is etched, the intermediate structure 12 as shown in FIG. 3 is formed.

As best understood with reference to the graph of FIG. 4 and the intermediate structure 12 of FIG. 3, the boron doping concentration profile may be selected so that the exposed surface of the doped diamond layer 25 has a relatively high boron doping concentration. The boron doping profile for the portion of the doped diamond layer 25 after graphite etching extends between depth A and B on the graph of FIG. 4, corresponding to depth A and B shown in FIG. 3. It has been found that a boron doping concentration of preferably at least about $10^{20}$ atoms/cm$^3$ at the surface of the exposed doped diamond layer 25 (depth A), as measured by secondary ion mass spectrometry (SIMS), provides a sufficiently high doping level to ensure low resistance source and drain electrodes 31, 32.

The processing parameters may be controlled during ion implantation and annealing to form a desired boron doping concentration. For example, the boron doping concentration may be selected in the range from about $5 \times 10^{15}$ ions/cm$^3$ to about $5 \times 10^{17}$ ions/cm$^2$. The energy of the boron ions may be controlled within the range of about 20 KeV to about 80 KeV. The substrate temperature may be controlled, for example, the diamond may be left at nominal room temperature or may be maintained at a temperature of about 200° C. As described above, nominal room temperature means the implantation process starts at about room temperature and the ion implantation causes the temperature of the diamond to increase to a slightly higher value, such as about 100° C., for example. A preferred temperature for the diamond during implantation is about 100° C. In addition, the annealing time and temperature may also be adjusted to form a desired profile. For example, the boron implanted diamond may be annealed at a temperature of about 950° C. to about 1200° C. for a time period of about 30 minutes to about 2 hours. Exact process parameters for a desired boron concentration profile may be obtained empirically.

Figure 5:
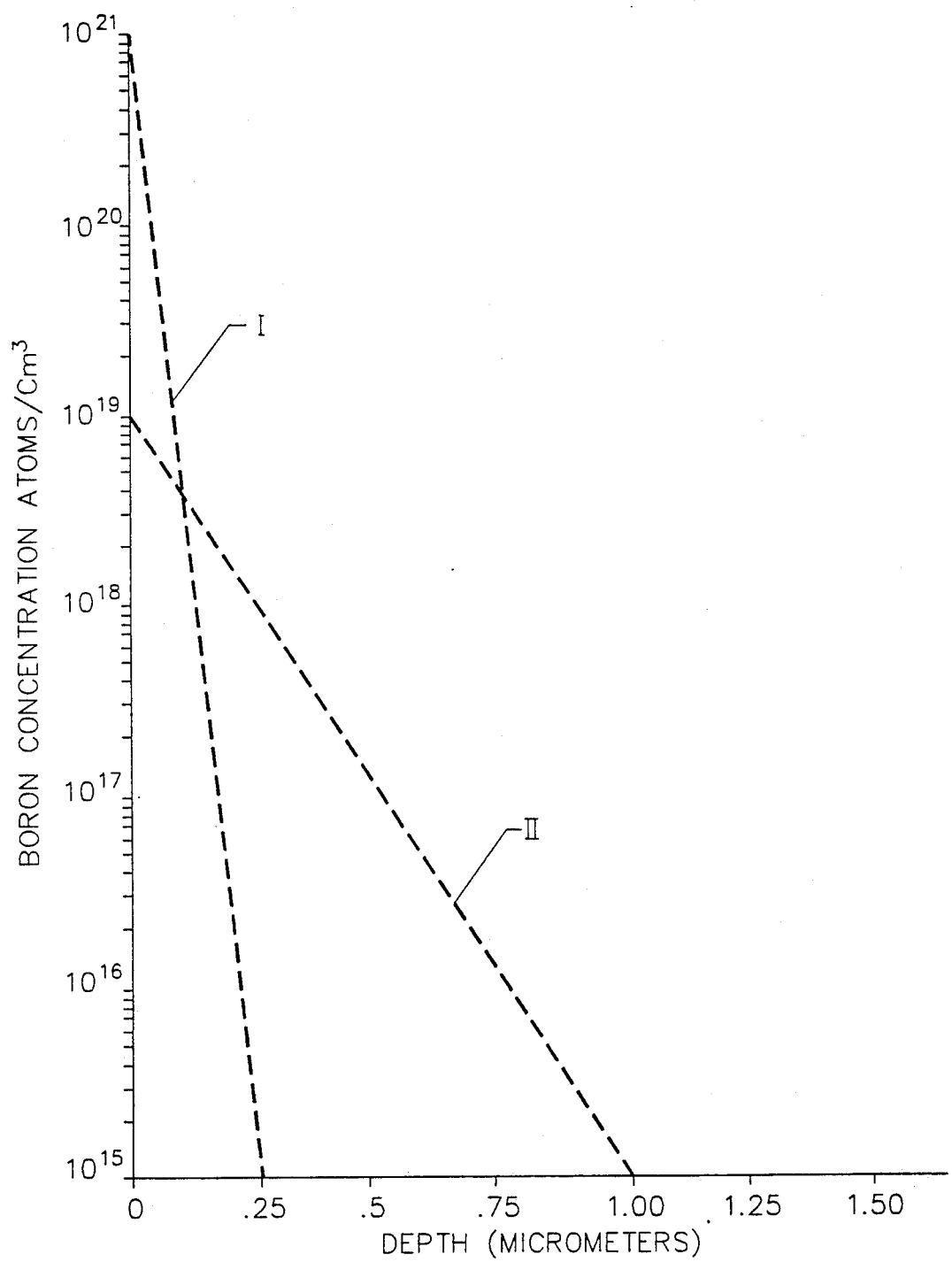
FIG. 5 is a theoretical graph showing a range of boron doping profiles achievable with a single implantation step, according to the invention, and approximated by straight lines.

FIG. 5 shows two linear approximations of profiles I, II readily achievable according to the method of the invention. As shown, the profiles I, II have been approximated by straight lines for simplicity of understanding. The profile designated as I may be achieved which has a boron doping concentration on the surface of about $10^{21}$ atoms/cm$^3$ and which extends to a depth into the diamond of about 0.25 μm (2500 Å). The profile designated II has a boron doping concentration at the surface of about $10^{19}$ atoms/cm$^3$ and which extends to a depth of about 1.0 μm (10,000 Å). A desired boron doping concentration profile may be achieved within the approximate range defined by the profiles I, II by selecting appropriate processing parameters within the ranges given above.

Referring again to FIG. 1, the source and drain electrodes 31, 32 may be formed by depositing a refractory metal layer 31a, 32a on the exposed doped diamond layer 25. The gold layer 31b, 32b is deposited on the first layer and annealed. In particular, the adhesion of the electrodes 31, 32 may be improved by annealing the metal layers at a temperature of about 800° C. to about 850° C. for a time period of about 15 minutes to about 90 minutes. In addition, the gate insulating layer 35 may be deposited onto the diamond layer 25 by conventional techniques, such as chemical vapor deposition (CVD) or plasma enhanced CVD (PECVD). Exemplary materials for the insulating layer 35 include insulating diamond, silicon dioxide, silicon nitride, and aluminum oxide. The gate electrode 36 is also formed on the insulating layer 35 by conventional techniques, such as CVD or PECVD.

Figure 6:
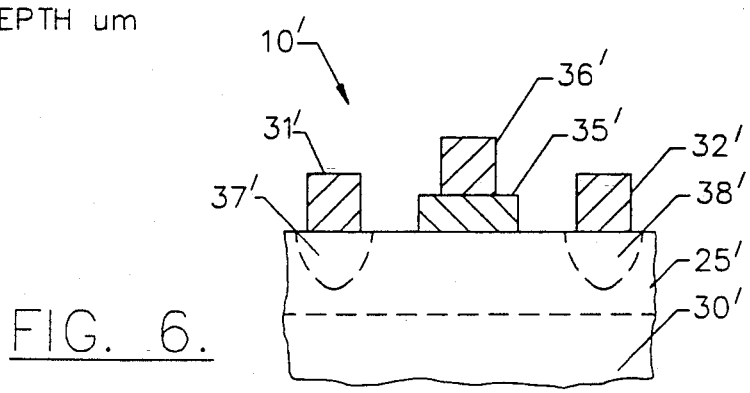
FIG. 6 is a cross-sectional side elevation view of another embodiment of an insulated gate field-effect transistor according to the present invention.

As shown in an alternate embodiment of the transistor 10' of FIG. 6, an additional improvement in lowering the resistance of the source and drain electrodes 31', 32' may be obtained by a second boron implantation, annealing and graphite etch of the source region 37' and drain region 38' of the diamond layer 25'. The second implantation may preferably be conducted with a higher boron dose than the initial implantation. A preferred dose for the second implantation is about $10^{16}$ ions/cm$^3$ to about $5 \times 10^{17}$ ions/cm$^2$. The temperature during the second implantation is also typically higher than during the initial implantation. A preferred temperature range for the second implantation is about 100° C. to about 300° C. and at an energy of about 30 KeV to about 80 KeV.

The Example which follows is provided to further illustrate the invention, and is not to be construed as limiting thereof.

EXAMPLE

A layer of undoped polycrystalline diamond is deposited on a silicon substrate by a conventional CVD technique. Implantation of boron is carried out to a dose of the order of about $3.5 \times 10^{16}$ atoms/cm$^2$ at a moderate acceleration of about 60 KeV in a commercially available ion implanter. The implantation is carried out with the substrate at nominal room temperature, which as described above, increases to about 100° C. from the heat generated during the implantation process.

Figure 7:
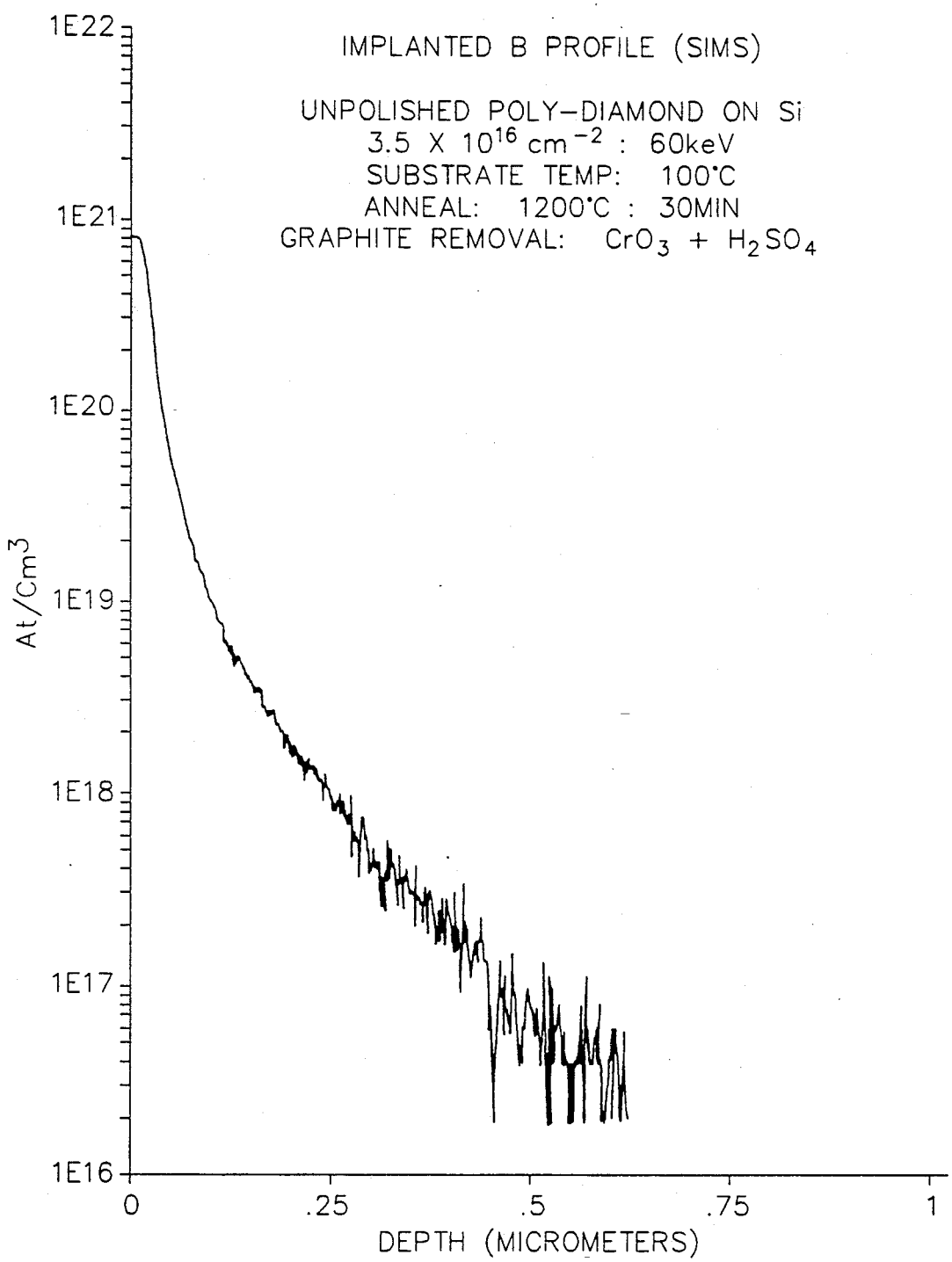
FIG. 7 is a measured graph of boron doping concentration versus depth into the diamond layer corresponding to the Example.

A subsequent anneal of the implanted diamond layer is performed at a temperature of about 1200° C. for about 30 minutes. The graphitized surface layer is removed by treating the substrate in a hot chromic acid and sulfuric acid solution. FIG. 7 is a graph of the implanted boron doping profile versus depth in the diamond layer on a silicon substrate as measured using secondary ion mass spectrometry (SIMS). The graph shows a truncated Gaussian doping concentration retained in the exposed diamond layer having a relatively high boron concentration approaching $10^{21}$ atoms/cm$^3$ at the surface of the layer. As can also be readily seen from the graph, the concentration generally decays and becomes nearly negligible past 0.5 μm (5000 Å) into the diamond layer.

The metal layers deposited directly on the relatively highly doped diamond layer serve as ohmic contacts. Therefore, selected areas are metallized to form source and drain electrodes. Field-effect transistor operation is obtained by depositing an insulating gate comprising a layer of silicon dioxide and a subsequently deposited metal film thereon and employing suitable biases to the source, gate and drain electrodes.

In summary, a desired boron doping profile may be achieved by the method according to the invention without requiring liquid nitrogen cooling or heating to a temperature beyond which conventional processing chambers can operate. The method provides a flexible fabrication process for achieving a desired boron doping concentration wherein the boron ion implantation may be achieved at room temperature or slightly elevated temperatures well within the processing limits of conventional processing chambers and equipment. The insulated gate field-effect transistor 10, 10' according to the invention provides improved high temperature performance and has low resistance at the source electrode 31, 31' and drain electrode 31, 32'.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A field-effect transistor comprising:
   a substrate;
   a boron-doped diamond layer on said substrate, said boron-doped diamond layer having a desired boron doping concentration profile extending in the depth direction into said diamond layer from the surface thereof opposite said substrate, said boron doping concentration being relatively high at the surface of said diamond layer and generally decreasing with increasing depth into said diamond layer;
   a drain electrode and a source electrode in laterally spaced apart relation on the relatively highly-doped surface of said diamond layer for forming respective low resistance ohmic contacts therewith; and
   an insulated gate electrode on said diamond layer between said drain and source electrodes, said insulated gate electrode comprising an insulating layer on the relatively highly-doped surface of said diamond layer and a gate electrode on said gate insulating layer.

2. The field-effect transistor according to claim 1 wherein the portion of said diamond layer between said source and gate electrodes and adjacent said insulated gate electrode defines a channel for the transistor, and wherein said desired boron concentration profile in said channel is sufficient for field-effect transistor operation.

3. The field-effect transistor according to claim 1 wherein said relatively high boron doping concentration at the surface of said diamond layer is no less than about $10^{20}$ atoms/cm$^3$.

4. The field-effect transistor according to claim 1 wherein said desired boron doping concentration profile a truncated generally Gaussian shape with the doping concentration expressed as a logarithm versus linear depth.

5. The field-effect transistor according to claim 4 wherein said truncated Gaussian profile is approximated by a straight line extending between a peak surface concentration and a negligible concentration at a predetermined depth into said diamond layer.

6. The field-effect transistor according to claim 5 wherein said peak surface concentration is about $10^{19}$ atoms/cm$^3$ to $10^{21}$ atoms/cm$^3$, wherein said negligible concentration is about $10^{15}$ atoms/cm$^3$, and wherein said predetermined depth coincident with said negligible concentration is about 2500 Å to about 10,000 Å.

7. The field effect transistor according to claim 1 wherein said source and drain electrodes each comprise an annealed bilayer structure including a refractory metal on said diamond layer and a gold layer on said refractory metal layer.

8. The field effect transistor according to claim 1 wherein said gate insulating layer comprises a material selected from the group consisting of insulating diamond, silicon dioxide, silicon nitride, and aluminum oxide.

9. A field-effect transistor comprising:
   a substrate;
   a boron-doped diamond layer on said substrate;
   a drain electrode and a source electrode in laterally spaced apart relation on the surface of said diamond layer opposite said substrate;
   the portion of said diamond layer extending between said source and drain electrodes defining a channel for the transistor, said channel having a desired boron doping concentration profile extending in the depth direction into said channel from the surface thereof opposite said substrate, said boron doping concentration being relatively high at the surface of said channel and generally decreasing with increasing depth into said channel, said desired boron doping concentration profile being sufficient for field-effect transistor operation; and
   an insulated gate electrode on said diamond layer adjacent said channel, said insulated gate electrode comprising an insulating layer on the surface of said diamond layer and a gate electrode on said gate insulating layer.

10. The field-effect transistor according to claim 9 wherein respective regions of said diamond layer adjacent said source and drain electrodes have a higher boron doping concentration than said surface of said channel to thereby form low resistance ohmic contacts between said source and drain electrodes and source and drain regions respectively of said diamond layer.

11. The field-effect transistor according to claim 9 wherein said relatively high boron doping concentration at the surface of said diamond layer adjacent said channel is no less than about $10^{20}$ atoms/cm$^3$.

12. The field-effect transistor according to claim 9 wherein said desired boron doping concentration profile is a truncated generally Gaussian shape with the doping concentration expressed as a logarithm versus linear depth.

13. The field-effect transistor according to claim 12 wherein said truncated Gaussian profile is approximated by a straight line extending between a peak surface concentration and a negligible concentration at a predetermined depth into said diamond layer.

14. The field-effect transistor according to claim 13 wherein said peak surface concentration is about $10^{19}$ atoms/cm$^3$ to $10^{21}$ atoms/cm$^3$, wherein said negligible concentration is about $10^{15}$ atoms/cm$^3$, and wherein said predetermined depth coincident with said negligible concentration is about 2500 Å to about 10,000 Å.

15. The field effect transistor according to claim 9 wherein said source and drain electrodes each comprise an annealed bilayer structure including a refractory metal on said diamond layer and a gold layer on said refractory metal layer.

16. The field effect transistor according to claim 9 wherein said gate insulating layer comprises a material selected from the group consisting of insulating diamond, silicon dioxide, silicon nitride, and aluminum oxide.

* * * * *

UNITED STATES PATENT AND TRADEMARK OFFICE
CERTIFICATE OF CORRECTION

PATENT NO.    :    5,254,862
DATED         :    October 19, 1993
INVENTOR(S)   :    Kalyankjumar et al.

It is certified that error appears in the above-identified patent and that said Letters Patent is hereby corrected as shown below:

Item [19] title page "Kalyankjumar et al." should be --Das et al.--; Item [75] "Das Kalyankjumar" should read --Kalyankumar Das--.

Column 1, line 60 "II" should be --IIa--.

Column 2, line 20 "in situ" should be --*in situ*--.

Column 3, line 62, "$10^{19}$" should be --$10^{15}$--.

Column 5, line 63, after "in" insert --A--.

Column 7, line 30 "$5 \times 10^{15}$ ions/cm$^3$" should be --$5 \times 10^{15}$ ions/cm$^2$--.

Column 8, line 22, "ions/cm$^3$" should be --ions/cm$^2$--.

Column 9, line 10 "31, 32'" should be --32, 32'--.

Signed and Sealed this

Fourteenth Day of June, 1994

Attest:

BRUCE LEHMAN

*Attesting Officer*    *Commissioner of Patents and Trademarks*